United States Patent [19]
Brune

[11] Patent Number: 5,204,885
[45] Date of Patent: Apr. 20, 1993

[54] METHOD AND DEVICE FOR EVALUATING A DIGITAL SIGNAL USING A DIGITAL COUNTER WITH LSB SIGNAL SEPARATELY APPLIED TO BOTH COUNTER AND REGISTER

[75] Inventor: Richard Brune, Fürth, Fed. Rep. of Germany

[73] Assignee: Siemens Aktiengesellschaft, Munich, Fed. Rep. of Germany

[21] Appl. No.: 693,667

[22] Filed: Apr. 30, 1991

[30] Foreign Application Priority Data

May 2, 1990 [EP] European Pat. Off. ........ 90108326.1

[51] Int. Cl.⁵ ..................... H03K 21/12; G06F 7/62
[52] U.S. Cl. .................................. 377/54; 377/55; 377/56
[58] Field of Search ................ 377/47, 55, 56, 44

[56] References Cited

U.S. PATENT DOCUMENTS

| | | | |
|---|---|---|---|
| 4,086,471 | 4/1978 | Takahashi | 377/44 |
| 4,499,589 | 2/1985 | Geesen | 377/44 |
| 4,914,616 | 4/1990 | Shiraishi et al. | 377/44 |
| 4,991,186 | 2/1991 | Payen et al. | 377/55 |
| 5,020,082 | 5/1991 | Takeda | 377/47 |
| 5,029,191 | 7/1991 | Robbins | 377/110 |

FOREIGN PATENT DOCUMENTS

WO91/11726 8/1991 PCT Int'l Appl. .

*Primary Examiner*—John S. Heyman
*Attorney, Agent, or Firm*—Kenyon & Kenyon

[57] ABSTRACT

A digital counting method and device for evaluating a digital signal ($S_S$) using a digital counter (Z) applies the digital signal ($S_s$) that is received by the input (ZE) of the digital counter (Z) as an output signal (N+1) to represent another binary position, in addition to the output signals (N) from the digital counter (Z).

2 Claims, 2 Drawing Sheets

FIG 2
FIG 3
FIG 4
FIG 5
FIG 6
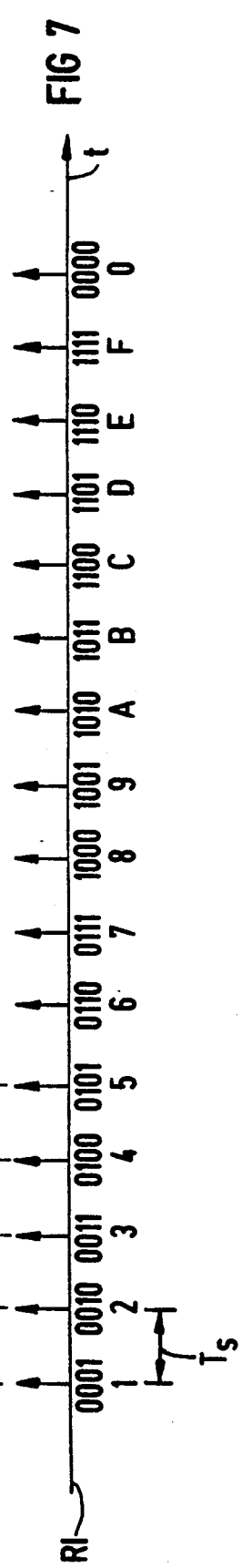
FIG 7

METHOD AND DEVICE FOR EVALUATING A DIGITAL SIGNAL USING A DIGITAL COUNTER WITH LSB SIGNAL SEPARATELY APPLIED TO BOTH COUNTER AND REGISTER

BACKGROUND OF THE INVENTION

The invention relates generally to methods and devices for evaluating a digital signal, and more particularly to such a method and device using a digital counter.

U. Tietze, Ch. Schenk, "Halbleiterschaltungstechnik" [*Semiconductor Circuit Engineering*], 6th edition, Springer Publishing House, Berlin, p. 247–259 discloses digital counters. Typically, these digital counters work according to a frequency-division principle, which is realized using flip-flop circuits. Each binary output of the counter is thereby in a fixed ratio to the frequency of the digital signal, which is transmitted to the counter input. The frequency of the least significant [rightmost] binary position in the known counters is half as great as the frequency of the digital input signal whose pulses are counted. To increase the counting range, one has to fall back each time on a counter with several binary positions. Increasing the number of positions of the counter increases the complexity of the counter, which is undesirable.

The present invention is directed to the problem of developing a method and a device for evaluating a digital signal using a digital counter with an increased counting range but without increased complexity.

SUMMARY OF THE INVENTION

The present invention solves this problem by applying the digital signal, which is received by the input of the digital counter, to the output to represent another binary position, in addition to the N binary signals from the digital counter, which represent the other binary positions.

According to a refinement of the method of the present invention, the digital signal ($S_s$) is extracted from a digital frequency signal (S) by synchronizing the digital frequency signal (S) to a clock signal (C). Then, the digital signal ($S_s$) is output to the digital counter. This synchronization can be performed by two series-coupled D flip-flops that have a clock input coupled to the clock signal (C), which has a frequency that is at least double the maximum frequency of the digital frequency signal (S).

According to another refinement of the method of the present invention, a data register receives the N binary signals and digital signal as an additional binary signal, and outputs the N binary signals and the additional binary signal as a single output signal.

According to another refinement of the method of the present invention, the data register is clocked with a clock signal ($T_s$) that is synchronized with the first clock signal (C). This synchronizes the data register to the same clock as its inputs.

According to another refinement of the method of the present invention, the digital counter receives the digital signal ($S_s$) as an input and outputs N binary signals representing N binary positions. The digital signal ($S_s$) is inverted with an inverter to form an inverted digital signal ($\overline{S_s}$), which is then output as an additional binary signal to represent an N+1 binary position, which is in addition to the N binary signals that represent N binary positions from the digital counter.

According to an embodiment of the method of the present invention, two D flip-flops are coupled in series—one flip-flop has the digital frequency signal (S) as an input along with a clock signal (C) as a clock input, wherein the clock signal (C) has a frequency that is at least double the maximum frequency of the digital frequency signal (S). The other D flip-flop also has the clock signal (C) as a clock input and outputs the digital signal ($S_s$) which is synchronous with the clock signal (C). A third D flip-flop with a timing signal as an input, the clock signal (C) as a clock input, outputs a synchronous timing signal ($T_s$) that is synchronized to the clock signal (C). An inverter receives the digital signal ($S_s$) and outputs an inverted digital signal ($\overline{S_s}$). Another inverter receives and inverts the inverted digital signal ($\overline{S_s}$), and outputs a delayed digital signal ($S'_s$). A digital counter receives the inverted digital signal ($\overline{S_s}$) as an input, evaluates the inverted digital signal ($\overline{S_s}$), and outputs N binary signals representing N binary positions. A data register receives the synchronous timing signal ($T_s$) as a clock input, receives the delayed digital signal ($S'_s$) as a first input, receives the N binary signals as a second input, and outputs a single binary signal with a least significant binary position and a N other binary positions, wherein the delayed digital signal ($S'_s$) represents the least significant binary position, and the N binary signals represent the N other binary positions.

According to a refinement of the embodiment of the method of the present invention, the first inverter causes a propagation delay in the digital signal $S_s$ such that the N binary signals are available to the data register at the precise moment in time.

BRIEF DESCRIPTION OF THE DRAWING

FIG. 2 illustrates the timing of the synchronous and inverted digital frequency signal according to the embodiment of the method of the present invention.

FIG. 3 illustrates the timing of the twice inverted and synchronous digital frequency signal, which corresponds to the input of the least significant bit position of the data register, according to the embodiment of the method of the present invention.

FIGS. 4 to 6 illustrate timing diagrams of the inputs to the most significant bit positions of the data register, according to the embodiment of the method of the present invention.

FIG. 7 shows the content of the data register resulting from the input of the signals shown in FIGS. 2 to 6, according to the embodiment of the method of the present invention.

DETAILED DESCRIPTION

Figure 1:
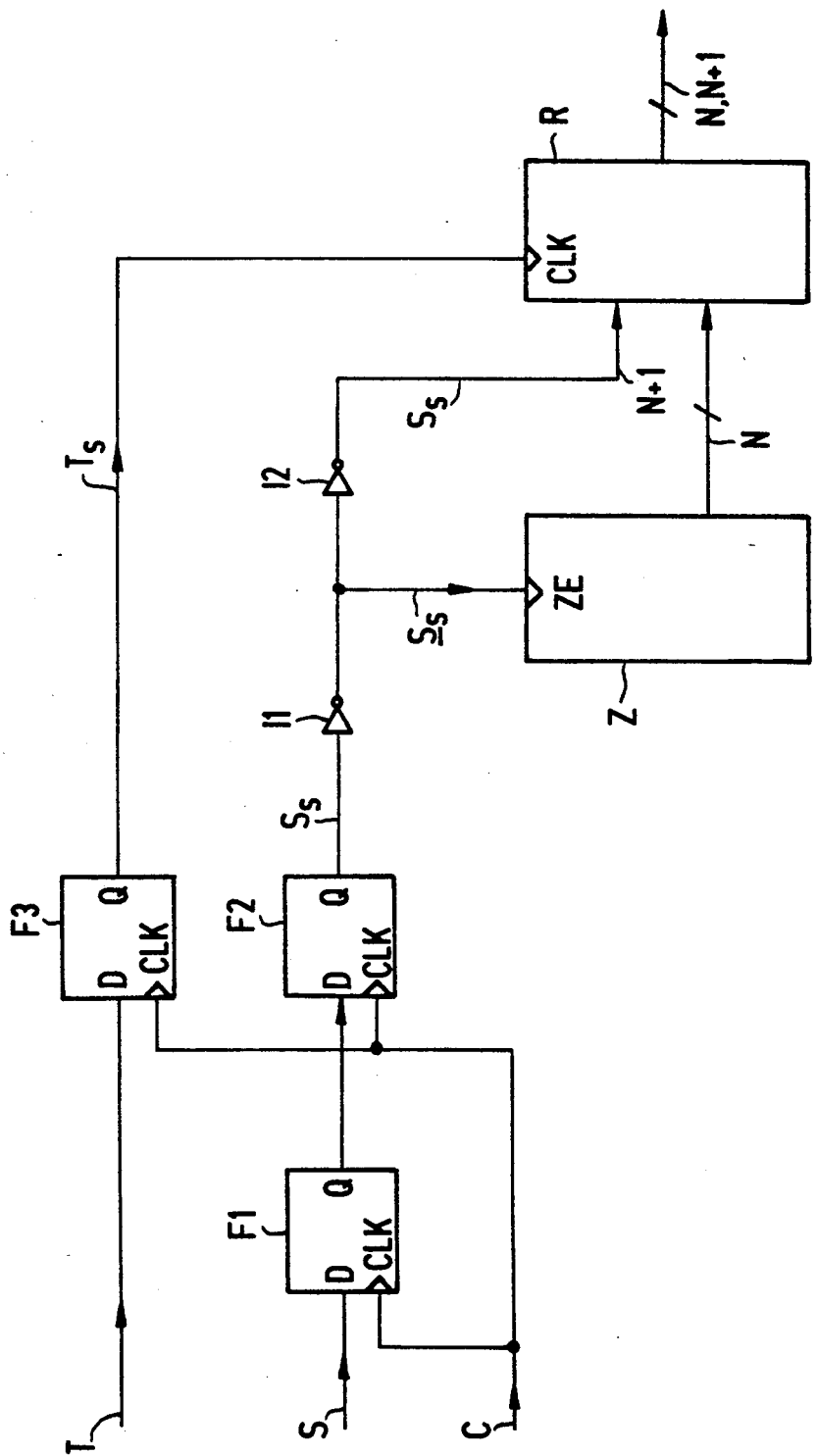
FIG. 1 illustrates an embodiment of the method of the present invention.

FIG. 1 shows an embodiment of a digital counting device, which comprises three D-flip-flops F1, F2, F3, two inverters I1, I2, a counter Z, as well as a data register R. The direction of the signal flow among the interconnected components is depicted by arrows. A digital signal S, whose pulses are supposed to be counted within a definite time, is applied to the input D of the first flip-flop F1. The digital signal S should thereby show a mark-to-space ratio of 1:1. A first clock signal C is transmitted to the clock input CLK of the first flip-flop as well as to the clock input CLK of the second flip-flop F2. With respect to the digital signal S, the first clock signal C meets the requirements of the sampling theorem, that is to say the frequency of the first clock signal C is greater than double the maximum frequency of the digital signal S. By means of the two series-connected D flip-flops and the first clock signal C, the digital signal S is applied as a synchronous signal $S_s$ to the output of the second flip-flop F2; in other words the positive edge of the synchronous signal $S_s$ has a fixed relationship to the positive edge of the first clock signal C.

The synchronous signal $S_s$ at the output Q of the second flip-flop F2 is inverted by means of the inverter I1 and transmitted as an inverted, synchronous signal $S_s$ to the counter input ZE. In an embodiment of the method of the present invention, the inverter I1 brings about a propagation delay of the synchronous signal $S_s$, so that the output signals N from the counter Z are available to the data register R at the right moment. The counter Z has an accuracy of N binary positions, whereby the least significant binary position corresponds therefore to the Nth binary position of half the frequency of the synchronous signal $S_s$. To increase the counting range, the synchronous signal $S_s$ is therefore used as the N+1 binary position of the counter. In addition, in the embodiment, the inverted, synchronous signal $S_s$ is inverted by means of a further inverter I2, which could also be accomplished using software. Thus, the N output signals from the counter are used as counting signals, and the synchronous, digital signal $S_s$ is used as the N+1 signal, whereby at this point the N+1 signal represents the least significant binary position.

In an embodiment of the method of the present invention, the counter output signals N, N+1 are transmitted to a data register R, which retrieves the counter content at specifiable moments. To avoid metastable states, the data register R is clocked with a synchronous clock signal $T_s$, which is derived from the clock signal T after being synchronized with the first clock signal C via a third flip-flop F3.

FIGS. 2 to 6 show timing diagrams which aid an understanding of the method of operation of the counting apparatus. The time relation to the timing diagrams is depicted in FIG. 7. FIG. 2 depicts a timing diagram of the inverted, synchronous signal $S_s$ received by the counter input ZE as shown in FIG. 1. As an example, it is assumed that the counter Z from FIG. 1 is provided with three binary outputs Q1, Q2, Q3. The timing diagrams of these three binary counter outputs Q1, Q2, Q3 are depicted in FIGS. 4, 5 and 6. The most significant binary position can be tapped off at the counter output Q3; the least significant binary position can be tapped off at the counter output Q1. Only $2^3$ different output states can be achieved with this counter; in other words it could only count up to eight in the binary system. As depicted in FIG. 3, when the synchronous signal $S_s$ is added as a least significant binary output signal Q0 to the counter output signals Q1, Q2, Q3, one obtains four binary output signals, so that a counting range of $2^4$ is achieved.

If the binary signals Q0, Q1, Q2, Q3 are retrieved into the data register R with the specified, synchronous clock signal $T_s$, then the binary and hexadecimal register content RI results as depicted in FIG. 7.

What is claimed is:

1. A digital counting device for evaluating a digital frequency signal (S) comprising:
   a) a first D flip-flop having the digital frequency signal (S) as an input, having a clock signal (C) as a clock input, and having an output, wherein the clock signal (C) has a frequency that is at least double a maximum frequency of the digital frequency signal (S);
   b) a second D flip-flop having the output of the first D flip-flop as an input, having the clock signal (C) as a clock input, and having a digital signal ($S_s$) as an output;
   c) a third D flip-flop having a timing signal as an input, a clock signal (C) as a clock input, and outputting a synchronous timing signal ($T_s$) that is synchronized to the clock signal (C);
   d) a first inverter receiving the digital signal ($S_s$) as an input and outputting an inverted digital signal ($S_s$);
   e) a second inverter receiving and inverting the inverted digital signal ($S_s$), and outputting a delayed digital signal ($S'_s$);
   f) a digital counter:
      i) receiving the inverted digital signal ($S_s$) as an input;
      ii) evaluating the inverted digital signal ($S_s$); and
      iii) outputting a plurality of N binary signals representing N binary positions;
   g) a data register receiving the synchronous timing signal as a clock input, receiving the delayed digital signal ($S'_s$) as a first input, receiving the plurality of N binary signals as a second input, and outputting a single binary signal having a least significant binary position and a plurality of N other binary positions, wherein said delayed digital signal ($S'_s$) represents the least significant binary position, and the plurality of N binary signals represent the plurality of N other binary positions.

2. The digital counting device according to claim 1, wherein the first inverter causes a propagation delay in the digital signal $S_s$ such that the plurality of N binary signals are available to the data register at a precise moment in time.

* * * * *